United States Patent [19]
Scott

[11] Patent Number: 5,624,741
[45] Date of Patent: Apr. 29, 1997

[54] INTERCONNECT STRUCTURE HAVING ELECTRICAL CONDUCTION PATHS FORMABLE THEREIN

[75] Inventor: David M. Scott, Wilmington, Del.

[73] Assignee: E. I. Du Pont de Nemours and Company, Wilmington, Del.

[21] Appl. No.: 797,489

[22] Filed: Nov. 22, 1991

Related U.S. Application Data

[63] Continuation-in-part of Ser. No. 531,328, May 31, 1990, abandoned.

[51] Int. Cl.⁶ .................................................. B32B 9/00
[52] U.S. Cl. ........................ 428/210; 428/209; 428/901; 428/404; 428/403; 174/262
[58] Field of Search .................................. 428/323, 328, 428/403, 209, 901, 173, 174, 137, 404, 329, 688, 689, 210; 174/226

[56] References Cited

U.S. PATENT DOCUMENTS

| | | | |
|---|---|---|---|
| 920,861 | 5/1909 | Geisenhoner. | |
| 2,321,587 | 6/1943 | Davie et al. | 117/93 |
| 2,332,116 | 10/1943 | Schmid | 176/24 |
| 2,784,389 | 12/1957 | Kelly | 340/173 |
| 2,923,920 | 2/1960 | Fitch | 346/173 |
| 2,993,815 | 7/1961 | Treptow et al. | 117/212 |
| 3,238,355 | 3/1966 | Van Eeck | 219/528 |
| 3,540,862 | 11/1970 | Roemer et al. | 428/403 |
| 3,540,894 | 11/1970 | McIntosh | 106/39 |
| 3,634,929 | 1/1972 | Yoshida et al. | 29/477 |
| 3,685,028 | 8/1972 | Wakabayashi et al. | 340/173 R |
| 3,832,192 | 8/1974 | McIntosh | 106/46 |
| 3,857,923 | 12/1974 | Gardner et al. | 423/327 |
| 3,864,715 | 2/1975 | Mastrangelo | 375/1 |
| 3,920,485 | 11/1975 | Ansell et al. | 148/6.3 |
| 3,926,916 | 12/1975 | Mastrangelo | 252/63.5 |
| 3,969,066 | 7/1976 | Smialek et al. | 431/95 A |
| 3,982,906 | 9/1976 | Hirai et al. | 29/182.5 |
| 3,990,098 | 11/1976 | Mastrangelo | 357/2 |
| 4,045,712 | 8/1977 | De Tommasi | 315/323 |
| 4,072,771 | 2/1978 | Grier, Sr. | 428/403 |
| 4,080,414 | 3/1978 | Anderson et al. | 264/41 |
| 4,243,460 | 1/1981 | Nagler | 156/275 |
| 4,247,594 | 1/1981 | Shea et al. | 428/328 |
| 4,359,414 | 11/1982 | Mastrangelo | 523/200 |
| 4,447,492 | 5/1984 | McKaveney | 428/328 |
| 4,458,297 | 7/1984 | Stopper et al. | 361/403 |
| 4,466,850 | 8/1984 | Eichelberger et al. | 156/276 |
| 4,536,535 | 8/1985 | Usals | 524/403 |
| 4,545,926 | 10/1985 | Fouts, Jr. et al. | 252/511 |
| 4,613,648 | 9/1986 | Usala | 524/555 |
| 4,655,864 | 4/1987 | Rellick | 156/89 |
| 4,677,742 | 7/1987 | Johnson | 29/591 |
| 4,699,831 | 10/1987 | Hartmann et al. | 428/35 |
| 4,726,991 | 2/1988 | Hyatt et al. | 428/329 |
| 4,851,364 | 7/1989 | Yatsuda et al. | 437/42 |
| 4,923,739 | 5/1990 | Jin et al. | 428/221 |
| 4,942,076 | 7/1990 | Panicker et al. | 428/137 |
| 4,975,314 | 12/1990 | Yano et al. | 428/213 |
| 5,164,264 | 11/1992 | Kugimiya et al. | 428/403 |

FOREIGN PATENT DOCUMENTS

| | | |
|---|---|---|
| 527687 | 10/1940 | United Kingdom. |
| 643549 | 9/1950 | United Kingdom. |

OTHER PUBLICATIONS

Tipler, Physics 2nd Ed., Worth Publ. 1982, pp. 673–677, 685–687.
Holme's & Loasby "Handbook of Thick Film Technology", Electrochemical Publications Ltd (1976) pp. 97–101.

*Primary Examiner*—Patrick Ryan
*Assistant Examiner*—Patrick Jewik

[57] ABSTRACT

An interconnect structure is characterized by a matrix formed of a continuous, substantially oxygen impermeable, anhygroscopic, inorganic dielectric material, having a dispersion of metal particles therein. The metal particles have an insulating layer thereon and are in abutting contact. The application of a predetermined electrical potential between spaced first and second points on the surface of the interconnect structure causes electrical breakdown of the coatings on the particles in the region between the points of application thereby irreversibly forming an electrical conduction path through the interconnect structure between the first and the second points.

19 Claims, 3 Drawing Sheets

# INTERCONNECT STRUCTURE HAVING ELECTRICAL CONDUCTION PATHS FORMABLE THEREIN

CROSS-REFERENCE TO RELATED APPLICATION

This application is a continuation-in-part of application Ser. No. 07/531,328, filed May 31, 1990, now abandoned

BACKGROUND OF THE INVENTION

1. Field of the Invention

The present invention relates to interconnection technology and, in particular, to a ceramic body having a dispersion of conductive particles therein which, upon application of a predetermined electrical potential, form continuous electrical conduction paths through the material of the ceramic body.

2. Description of the Prior Art

As the density and complexity of integrated circuits increase a limiting factor has been found to exist in the ability to interconnect signals emanating from a given integrated circuit to other devices. See, *Electronics*, April 1989, p.106. Present solutions to this interconnectability problem have evolved to the use of multilayer ceramic interconnecting structures.

Conductive tracings fired onto the surface of an insulating ceramic body define patterns of interconnection lines whereby a given integrated circuit may be electrically connected to other devices. The patterns of conductive materials are formed on a ceramic material layer using photolithography or silkscreen technology. The ceramic material may be made via thick film ("green tape") ceramic technology. Several such ceramic layers are laminated together to form a complex circuit, with connections between layers provided by "vias" (holes filled with metal). The top ceramic layer also provides bonding pads on which the chips are mounted. Suitable thick-film materials for such interconnects are manufactured and sold by the Electronic Materials Division of Electronics Department of E. I. du Pont de Nemours & Co. A similar process can be used with thin-film ceramic technology, and laminates with over thirty-two (32) layers have been made using such technology.

Alternative interconnection structures are also known. For example, U.S. Pat. No. 4,359,414, issued to Mastrangelo and assigned to the assignee of the present invention, discloses an insulating flexible polymeric film having metal particles dispersed therein. Upon application of a predetermined potential electrical breakdown occurs activating the particles to form a continuous electrical conduction path through the film. Such polymer-based compositions provide programmable electrical interconnections, but those materials may start to degrade at high temperatures.

SUMMARY OF THE INVENTION

The present invention relates to an interconnect structure having a matrix formed of a continuous, substantially oxygen impermeable, anhygroscopic, inorganic dielectric material. The inorganic dielectric matrix has therein a dispersion of metal particles, at least substantially all of the metal particles being coated by an insulating coating, such as a natural oxide tarnish. The dispersion contains a sufficient quantity of coated metal particles such that substantially all of the coated particles are in abutting contact with other particles.

The natural oxide tarnish, or other insulating coating (if provided), prevents electrical contact between the metal particles. However, upon application of a predetermined electrical potential across respective points on the interconnect structure electrical breakdown of the insulating coatings of the particles occurs along a generally linear path between the application points. The metal particles thus contact one another thereby to form a continuous electrical conduction path through the interconnect structure. A multiplicity of separate electrically conductive paths may be formed within the interconnect structure without significant crosstalk.

In one embodiment the inorganic dielectric matrix is formed by the insulating coating on the particles. In another embodiment the inorganic dielectric matrix is formed from a glass having a sintering temperature less than the melting temperature of the metal.

The interconnect structure in accordance with the present invention is stable at high temperatures and should have a higher thermal conductivity than previous organic compositions. The interconnect structure may thus be used for high-density circuit boards, for chip-to-chip wiring in complex electronic circuits and in other high density applications. It is believed that the interconnect structure of the present invention may find particular utility in implementing highly interconnected parallel distributed processing networks (so-called "neural networks"). An additional advantage is that the ceramic processing technology currently employed in thick film circuit board fabrication can be used to implement this invention.

BRIEF DESCRIPTION OF THE DRAWINGS

The invention will be more fully understood from the following detailed description thereof taken in connection with the accompanying drawings which form a part of this application and in which.

DETAILED DESCRIPTION OF THE INVENTION

Figure 1:
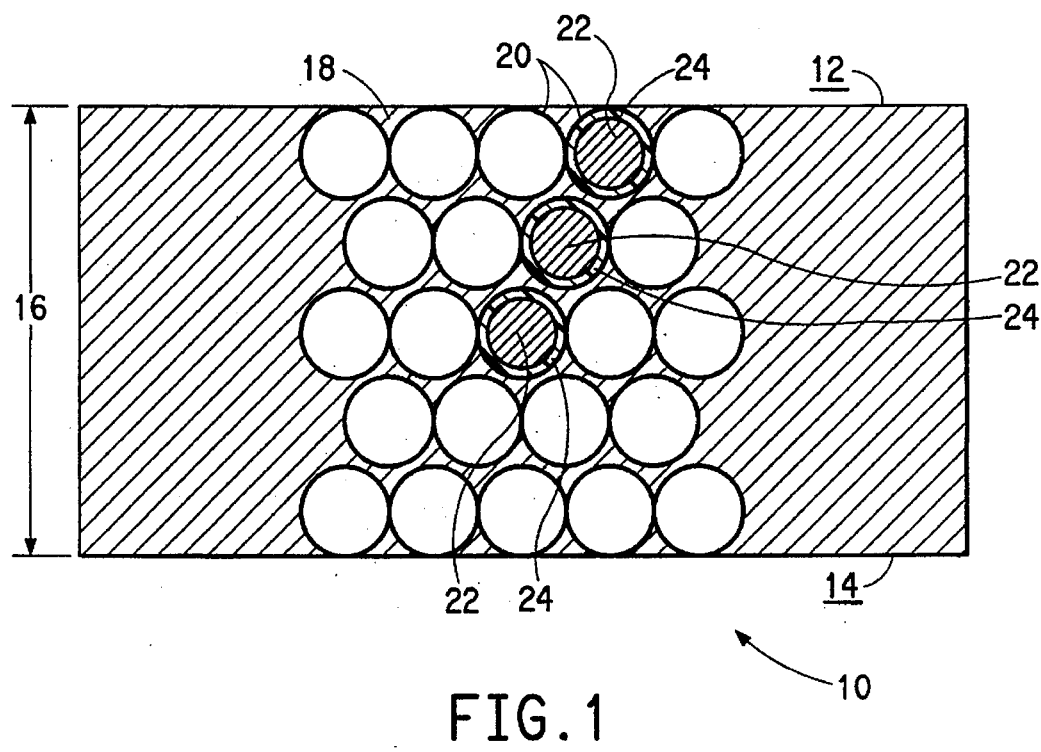
FIG. 1 is side sectional view of an interconnect structure having metal particles dispersed therein in accordance with the present invention, some of the particles being shown in section.

Throughout the following detailed description similar reference characters refer to similar elements in all figures of the drawings.

With reference to FIG. 1 shown is an interconnect structure generally indicated by the reference character 10 in accordance with the present invention. The interconnect structure 10 shown in FIG. 1 takes the form of a generally rectanguloid body having an upper surface 12 and a lower surface 14. The upper surface 12 and the lower surface 14 are spaced apart by a predetermined thickness dimension 16. It is, of course, understood that a body 10 in accordance with the present invention may exhibit other external configurations.

The interconnect structure 10 has a continuous, substantially oxygen impermeable, anhygroscopic matrix 18 of an inorganic dielectric material having dispersed therewithin a dispersion of metal particles 20. As used herein the term "anhygroscopic" means that the matrix does not remove moisture from the ambient air. The term "impermeable" means the matrix does not permit gases, especially oxygen, to pass therethrough.

Each metal particle 20 includes a central core 22 surrounded by a layer, or coating, 24 of an insulating material. Each particle 20 has a generally smooth exterior configuration preferably spheroidal or nodular in shape, i.e., without sharp edges. Preferably, each conductive particle 20 is made from a metal which forms a suitable oxide tarnish, such as aluminum, although any other electrically conductive materials may be used. Mixtures of electrically conductive powdered materials lie within the contemplation of the invention.

At least substantially all, but preferably all, of the particles 20 dispersed within the matrix 18 exhibit the insulating coating 24. The insulating coating 24 is preferably very thin, being on the order of 0.001 to 0.01 microns. Most conveniently, the insulating coating 24 is formed by the natural oxide oxide tarnish of the metal forming the core 22, although it should be understood that other insulating materials or other layers of coating material may be applied to the core 22 to form the coating 24. The particles 20, including the coating 24, are microscopic in size with a mean particle diameter on the order of 0.1 to 10 microns. The volume fraction of the particles 20 with respect to the overall volume of the interconnect structure 10 is sufficient to establish particle-to-particle contact. The dielectric coating 24 around each particle prevents electrical contact between the cores 22 in spite of the physical contact between particles.

The purpose of the non-conducting matrix 18 is to hold the coated particles 20 in abutting contact with each other and to protect the particles from the environment. Most simply, the matrix may be defined by the coatings 24 of the particles themselves, although it should be understood that other non-conducting materials, such as glass, may be used. To be suitable for use as the matrix a glass material should, but not necessarily, have a sintering temperature that is less than the melting point of the material in the conductive particles.

The presence of the oxide coating 24 between the particles 20 prevents electrical contact, so the resistivity of the interconnect structure is quite high. However the normally non-electrically conducting character of the body of the interconnect structure 10 may be converted to localized electrical conduction paths through the volume of the interconnect structure by the application of electrical potential between two spaced points thereon. As may be understood with reference to FIG. 2, application of a predetermined electrical potential between a first point (as the point A or the point B on the surface 12) and one (or more) other points on other surfaces of the structure 10 (e.g., with respect to point A, the points C and D; with respect to point B, the points E and F) results in the electrical breakdown of the insulating coating 24 on the particles 20 that lie generally along the straight line of intersection between the points at which the potential is applied. As a result, the material of the cores 22 of the particles in this region of the body contact one with the other thereby to form continuous electrical conduction paths 32, 34, 36 and 38 between the application points. Each of these conductive paths may be conceptualized as a series of microscopic metallic bridges connecting strings of the particles.

The strength of the applied field will be at a maximum in the region between the application points of the two electrodes. Since the oxide layer is very thin the electric field can easily exceed the dielectric strength of the oxide ($10^5$ V/cm for aluminum oxide) at relatively low voltages. Once dielectric breakdown occurs and a first bridge is formed between metal particles the strength of the field increases between the remaining particles. Bridges are formed in a random sequence, starting with the "weakest link", until there is a complete conducting path from one electrode to the other. The formation of the path is irreversible. A single path can be as narrow as the nominal particle size, and multiple paths can be programmed in a single substrate.

The application points A through F for the electrodes may take the form of conduction pads printed on the appropriate surfaces of the interconnect structure, although such need not necessarily be the case. If provided the pads are preferably formed using a thick film conductor composition. It should also be understood that the points of application of the electrical potential (i.e., the points of electrode contact) on the body need not occur only on opposed surfaces thereof, but may occur at any points on the surface of the interconnect structure. It should also be understood that the potential should be applied through an appropriate current limiting resistor, on the order of one hundred (100) K ohms to one (1) mega ohm.

If the particles are made of aluminum or some other readily-oxidized material, the bridges connecting the particles may be destroyed by oxygen diffusing into the interconnect structure from the ambient air. For this reason the material of the matrix 18 must be relatively impermeable to oxygen in order to prevent the destruction of these connections. In addition, it is important that the matrix does not change in terms of its electrical properties. For instance, if the matrix absorbs moisture from the environment, the dielectric properties of the matrix may change and cause the material to behave in an unpredictable manner. For this reason the matrix should be anhygroscopic, i.e., it does not absorb or remove moisture from the air.

The ability to form continuous electrical conduction paths between selected points on the surfaces of the interconnect structure makes the structure useful in a variety of applications. Included among such applications is the formation of an array of interconnection lines between inputs and outputs of the processing elements used to define parallel distributed processing networks.

EXAMPLE 1

In its most basic form, the interconnect structure can be made by pressing aluminum powder together. The powder has a natural oxide coating which tends to bind the individual aluminum particles together. In this example the aluminum oxide forms the dielectric matrix. For example, 0.45 grams of Alcan X-65 aluminum powder (seven (7) micron nominal particle size) were pressed at fifty thousand (50,000) psi into a pellet thirteen (13) mm in diameter and 1.6 mm thick. Measuring across its thickness the pellet had an initial resistance of greater than twenty (>20) Megohms (off-scale). Electrodes were applied to two points on the surface of the pellet and a DC voltage was applied to the electrodes. Current began to flow at approximately one hundred (100) volts. The resistance was then measured to be fifty-five (55) Kilohms. A greater voltage (200 volts) was applied, and the resistance dropped to sixteen hundred (1600) ohms. Resistances as low as twenty (20) ohms have been obtained from these pellets, with the final resistance obtained being a function of the maximum applied voltage. The resistance between any two "unprogrammed" contact points (i.e., points other than the points of application of the potential) remained high.

EXAMPLE 2

A preferred embodiment of the invention is a glass-based ceramic composite tape that has been loaded with an appropriate amount of partially-oxidized metal powder. In this preferred approach, the dielectric matrix which binds the particles together is a glass.

A mixture containing:

12.0 g aluminum powder (Alcan X-65, spheroidal particles);
28.0 g glass frit;
1.2 g plasticizer;
11.2 g binder (31% solids);
15.0 cc 1,1,1-TCE (solvent)

was ball milled for eighteen (18) hours to form a ceramic slip.

The glass frit used was an alumino-silicate glass having boron, calcium and lead therein supplied by Ferro Corporation, Cleveland, Ohio. The plasticizer used was that sold by Monsanto Corporation as "Santicizer 160". The binder used was an acrylic binder manufactured and sold by E. I. du Pont de Nemours and Company.

A tape twenty (20) mils thick was cast and allowed to dry. The final tape thickness was seven (7) mils. A two (2) inch square cut from the tape was fired in air at four hundred (400) degrees C. for four (4) hours, then fired in nitrogen at eight hundred fifty (850) degrees C. for two (2) hours. The resistance through the resultant part was greater than twenty (>20) Megohms. When a programming pulse of five hundred (500) volts was applied across two application points on the part (through a current limiting resistor) the resistance dropped to 145 Kilohms.

If this formulation is optimized with regard to either powder loading or choice of glass it is believed to be possible to achieve a much lower resistance in the final part. In order to maintain the shape of the particles it is believed desirable to use a glass frit that sinters at a temperature below the melting point of the metal (660 degrees C. for aluminum).

Figure 2:
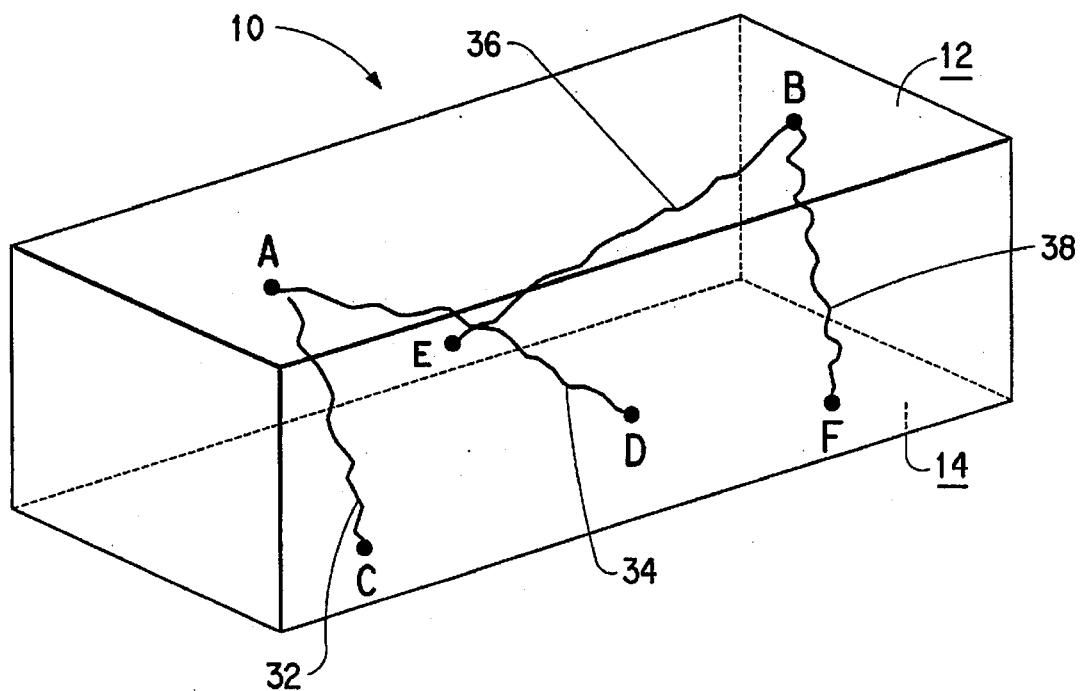
FIG. 2 is a highly stylized perspective representation of the interconnect structure of FIG. 1 with a portion thereof broken away to illustrate the presence of an electrical conduction paths through the volume thereof.

There appears to be only a relatively small probability that electrical crosstalk would occur between the conduction paths 32 and 38 respectively defined from the pad A to the pad C and from the pad B to the pad F (FIG. 2). However, owing to the manner in which the electrical conduction paths are formed, a potentiality exists that crosstalk may develop between relatively closely spaced electrical conduction paths, such as the conduction paths 34 and 36 respectively defined from the pad A to the pad D and from the pad B to the pad E. (As a point of clarification, it should be understood that the electrical conduction paths 34 and 36 in FIG. 2 are meant to be construed as being independent of each other.)

Accordingly, it lies within the contemplation of this invention to configure the interconnect structure in a manner which physically limits the localities within the interconnect structure through which the conductive paths occur.

Figure 3A:
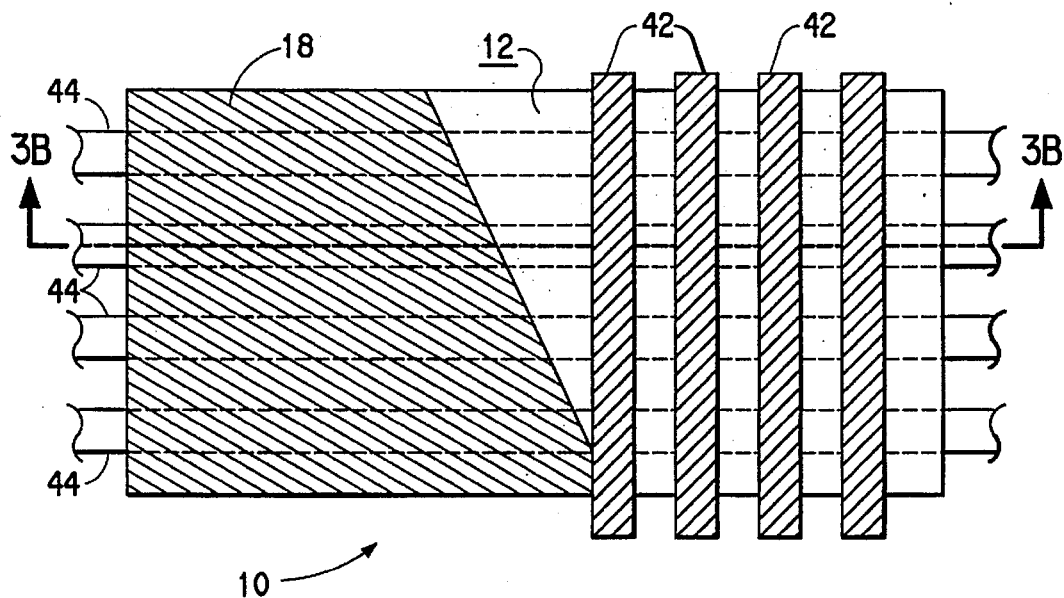
FIG. 3A is a plan view of an arrangement of an interconnect structure in accordance with this invention in which the probability of crosstalk is minimized with portions of the structure of FIG. 3A being broken away.
Figure 3B:
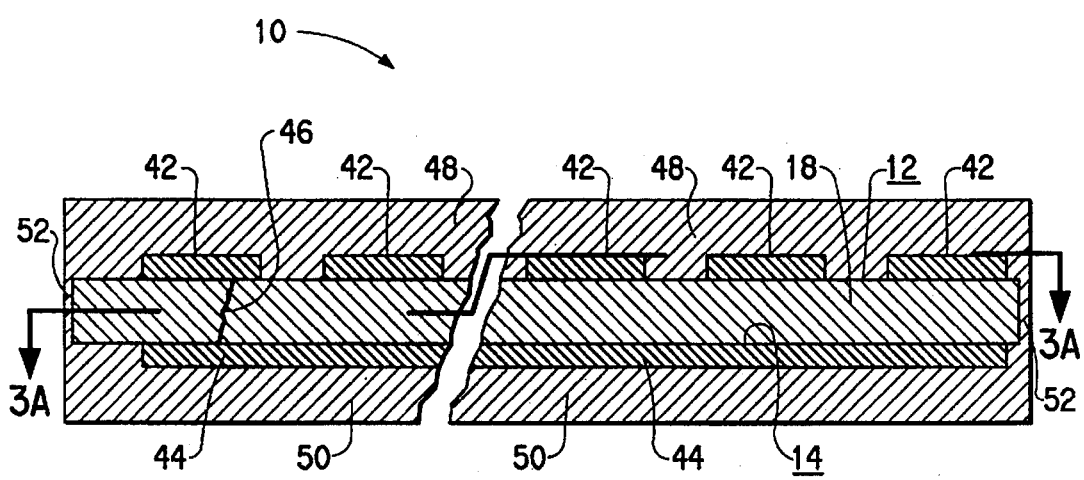
FIG. 3B is a side sectional view of the interconnect structure of FIG. 3A, taken along section section lines 3B—3B therein, with a portion of the interconnect structure of FIG. 3A being removed for clarity.

FIGS. 3A and 3B show a first embodiment of an interconnect structure that places a physical limitation on the regions of the structure through which conduction paths occur by localizing the regions in which relatively high electrical fields can occur. In accordance with this embodiment of the invention, the interconnect structure 10 is formed to exhibit a central, substantially planar layer of the matrix 18. The layer of the matrix 18 may, for example, be formed in a manner similar to that described in connection with the tape of Example 2. A layer of a continuous, substantially oxygen impermeable, anhygroscopic, inorganic dielectric material is thus defined. This inorganic dielectric material has therein a dispersion of metal particles, with at least substantially all of the metal particles being coated by an insulating layer. The dispersion contains a sufficient quantity of coated particles such that substantially all of the coated particles are in abutting contact with at least one other particle. The layer of the matrix 18 has a first surface, again indicated by the reference character 12, with the second surface of the layer being indicated by the reference character 14.

Instead of conductive pads, in the embodiment of the interconnect structure shown in FIGS. 3A and 3B, a first array of conductive traces 42 is disposed on the first surface 12 of the layer of the dielectric matrix 18, while a second array of conductive traces 44 is disposed on the second surface 14 of the layer 18. Any predetermined number of traces 42, 44 may be provided in each array.

The axes of the traces 42 in the first array are preferably inclined at a predetermined angle with respect to the axes of the traces 44 in the second array. The disposition of the traces 42 and the traces 44 relative to each other may be better understood with reference to FIG. 3A, in which the traces 42, and 44 form a grid-like pattern with the axis of each of the traces 42, 44 defining a predetermined angle with respect to each other, the angle typically being ninety degrees.

The conductive traces 42, 44 are preferably formed from paste-like dispersions of metal particles (e.g., gold, silver, platinum) in a glass binder. Suitable conductive pastes are available from the Electronic Materials Division of E. I. du Pont de Nemours & Co., Wilmington, Del. The traces 42, 44 may be applied onto the appropriate surfaces 12, 14 by screen printing or any convenient alternate technique.

With an interconnect structure formed as shown in FIGS. 3A and 3B, the application of a predetermined electrical potential between a conductive trace 42 in the first array and a conductive trace 44 in the second array causes electrical breakdown of the coatings on the particles dispersed in the region of the layer of the matrix 18 that is disposed between that trace 42 and that trace 44. As a result, shown in FIG. 3B is an electrical conduction path 46 that is irreversibly formed through that region of the layer 18 between that trace 42 and the trace 44. A similar conduction path may be formed between a selected other one of the traces 42 in the first array and a respective other one of the traces 44 of the second array. Since the configuration of the interconnect structure 10 of FIGS. 3A and 3B localizes the regions of the matrix 18 in which relatively high electrical fields can occur, the locations within the layer of the matrix 18 at which the conduction path 46 may occur are physically limited. It is noted that it lies within the contemplation of the present invention to provide conduction paths from a given one of the traces in one array to more than one of the traces in the other array. The locations within the layer of the matrix 18 of such other conduction paths 46 are also physically limited.

In order to complete the interconnect structure 10 an upper and a lower layer 48, 50, respectively, of insulating material may be provided over the matrix layer 18 and the traces 42, 44 thereon. As seen at reference character 52, the layers 48, 50 of insulating material may join together adjacent to the lateral margins of the interconnect structure 10, thereby enclosing the same. The insulating layers 48, 50 may be conveniently provided by building and firing successive layers of an insulating material, such as a castable ceramic composition, commonly known as "green tape", sold by Electronics Department of E. I. du Pont de Nemours & Co., Wilmington, Del. The composition disclosed in U.S. Pat. No. 4,536,535 (Usala) and in U.S. Pat. No. 4,655,864 (Rellick), both assigned to the assignee of the present invention, are representative of such castable ceramic compositions.

It should be apparent that an interconnect structure 10 having the layers 18, 48 and 50 may be built and simultaneously co-fired. Extensions of the interconnect structure 10 shown in FIGS. 3A and 3B to include additional layer(s) of the matrix 18 (each with traces 42, 44) having the dispersion of the coated particles therein also lies within the contemplation of the present invention.

—o—O—o—

Figure 4A:
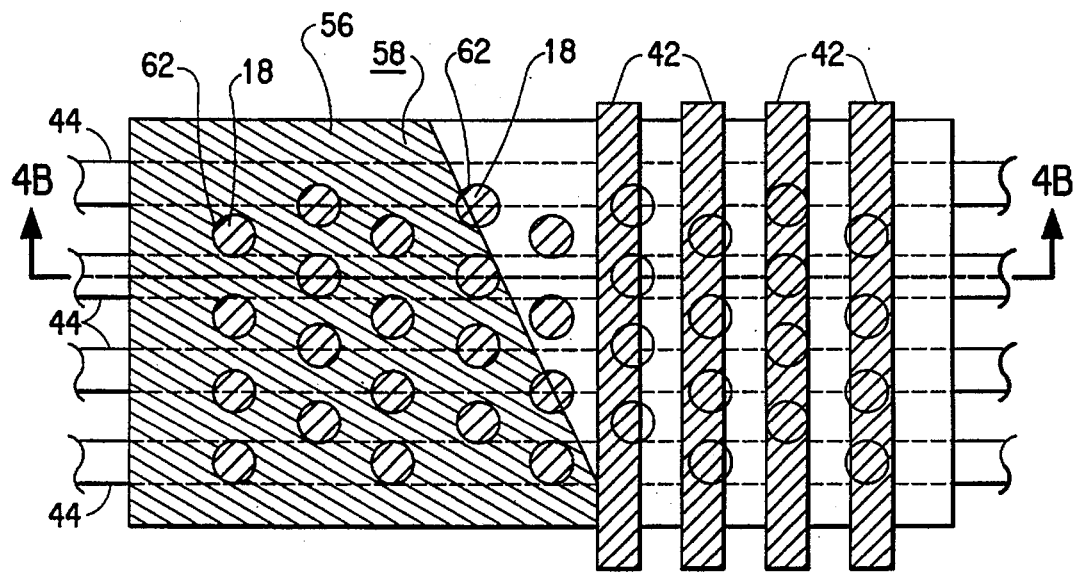
FIG. 4A is a plan view of an alternate arrangement of an interconnect structure in accordance with this invention in which the probability of crosstalk is minimized, again with portions of the structure of FIG. 4A being broken away.
Figure 4B:
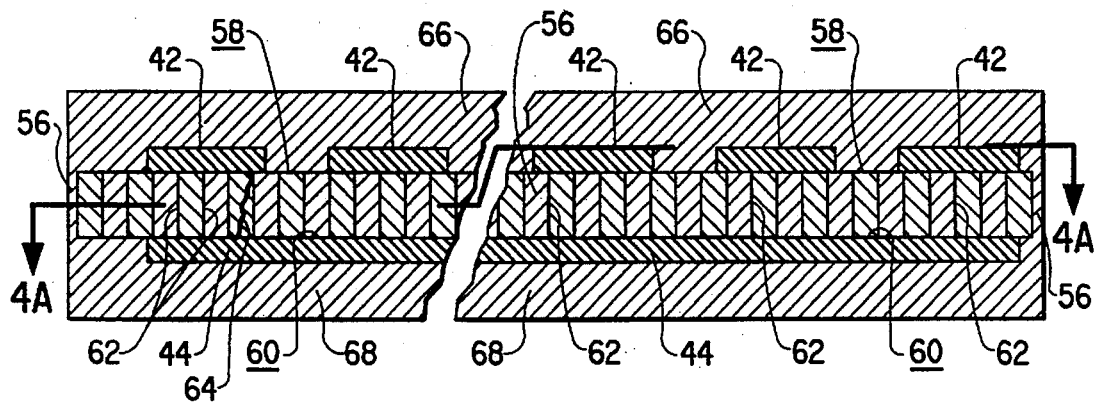
FIG. 4B is a side sectional view of the interconnect structure of FIG. 4A, taken along section section lines 4B—4B therein, with a portion of the interconnect structure of FIG. 4A being removed for clarity.

FIGS. 4A, 4B shows an embodiment of an interconnect structure 10 that places a physical limitation the regions of the structure through which conduction paths may occur by localizing the dispositions of the matrix 18 within the interconnect structure.

In accordance with this embodiment of the invention the interconnect structure includes a central layer 56 formed of an insulating material, as a layer of the green tape material mentioned above. The layer 56 of electrically insulating material has a first surface 58 and a second surface 60 thereon. The layer 56 may be formed using the same castable ceramic composition identified immediately above. A first array of conductive traces 42 is again disposed on the first surface 58 of the insulating layer 56 and a second array of conductive traces 44 is disposed on the second surface 60 of the insulating layer 62. The axis of each trace 42 in the first array again defines a predetermined angle, typically ninety degrees, with respect to the axes of the traces 44 in the second array. This arrangement is illustrated in FIG. 4B.

In accordance with this aspect of the invention the layer 56 of insulating material has a plurality of vias 62 formed therein. The vias 62 extend between the first surface 58 and the second surface 60 of the insulating layer 56. The vias 62 are sized and arrayed in a pattern such that each trace 42 in the first array communicates with at least one trace 44 in the second array through at least one via 62. In this manner registration problems which may attend the location of traces in the first and second arrays 42, 44 with respect to vias 62 in the layer 56 are avoided.

At least substantially all of the vias 62 are filled with the matrix 18 of the continuous, substantially oxygen impermeable, anhygroscopic, inorganic dielectric material having therein a dispersion of metal particles, with at least substantially all of the metal particles being coated by an insulating layer. The dispersion contains a sufficient quantity of coated particles such that substantially all of the coated particles are in abutting contact with at least one other particle.

In an interconnect structure of FIGS. 4A and 4B in accordance with this aspect of the invention the application of a predetermined electrical potential between a conductive trace 42 in the first array and a conductive trace 44 in the second array causes electrical breakdown of the coatings on the particles in the matrix 18 in the via 62 disposed between a selected trace 42 and a selected trace 44. An electrical conduction path 64 through one or more of the via(s) 62 between the selected traces 42, 44 is thereby irreversibly formed. Similar to the situation with the structure of FIGS. 3A and 3B, conduction paths may also be formed between another of the traces 42 and a respective selected other trace 44, or between a selected trace in one array with two or more traces in the other array, all without the possibility of crosstalk.

Similar to the situation in FIGS. 3A, 3B, the interconnect structure 10 of FIGS. 4A, 4B may be completed by providing an upper and a lower layer 66, 68, respectively, of insulating material. The insulating layers 66, 68 may be conveniently provided by building and firing successive layers of the castable ceramic composition mentioned earlier. Since the central layer 56 is also formed of that same castable ceramic composition, the layers 66, 68 effectively join with the lateral margins of the central layer 56 to enclose the interconnect structure 10.

It should again be apparent that an interconnect structure 10 having the layers 56, 66 and 68 may be built and simultaneously co-fired. Extensions of the interconnect structure 10 shown in FIGS. 4A and 4B to include additional layer(s) 56 (each with traces 42, 44) also lies within the contemplation of the present invention.

—o—O—o—

In yet another aspect, it may be desirable to form the coating 24 for the particles 22 of a material having a property such that once a complete electrical conduction path is formed through the coating 24 on that particle no further dielectric breakdown can take place in that coating 24. For example, if a particular chemical component of the coating 24 must exceed a minimum local threshold concentration in order to mediate the dielectric breakdown, then the breakdown process may be limited by restricting the local concentration of that component in the coating. Thus, if the amount of that component exhausted by the occurrence of a breakdown is such that the remaining concentration of that component is below the required threshold, then no further dielectric breakdown will be able to occur in the coating surrounding that particular particle.

—o—O—o—

Those skilled in the art having the benefit of the teachings of the present invention as hereinabove set forth may effect numerous modifications thereto. Such modifications are, however, to be construed as lying within the contemplation of the present invention as defined by the appended claims.

What is claimed is:

1. An interconnect structure having a matrix formed of a continuous, substantially oxygen impermeable, anhygroscopic, inorganic dielectric material, the inorganic dielectric material having therein a dispersion of metal particles, at least substantially all of the metal particles being coated by an insulating coating, the dispersion containing a sufficient quantity of coated particles such that substantially all of the coated particles are in abutting contact with at least one other particle, the application of an electrical potential between spaced first and second points on the surface of the interconnect structure sufficient to cause electrical breakdown of the coatings on the particles in the region between the points of application irreversibly forming an electrical conduction path through the interconnect structure between the first and the second points.

2. The interconnect structure of claim 1 wherein the continuous, substantially oxygen impermeable, anhygroscopic, inorganic dielectric matrix is formed from the insulating coating of the metal particles.

3. The interconnect structure of claim 1 wherein the continuous, substantially oxygen impermeable, anhygroscopic, inorganic dielectric matrix is a glass having a sintering temperature less than the melting point of the metal in the metal particles.

4. The interconnect structure of claim 3 wherein each of the metal particles has a generally smooth, rounded exterior configuration.

5. The interconnect structure of claim 2 wherein each of the metal particles has a generally smooth, rounded exterior configuration.

6. The interconnect structure of claim 1 wherein each of the metal particles has a generally smooth, rounded exterior configuration.

7. An interconnect structure comprising:

a layer of a matrix formed of a continuous, substantially oxygen impermeable, anhygroscopic, inorganic dielectric material, the inorganic dielectric material having therein a dispersion of metal particles, at least substantially all of the metal particles being coated by an insulating coating, the dispersion containing a sufficient quantity of coated particles such that substantially all of the coated particles are in abutting contact with at least one other particle, the layer having a first and a second surface thereon, a first array of conductive traces disposed on the first surface of the layer, a second array of conductive traces disposed on the second surface of the layer, each trace having an axis therethrough, the axes of each trace in the first array defining an angle with respect to the axes of the traces in the second array, the application of an electrical potential between a conductive trace in the first array and a conductive trace in the second array sufficient to cause electrical breakdown of the coatings on the particles in the layer disposed between that trace in the first array and that trace in the second array irreversibly forming an electrical conduction path through the layer between that trace in the first array and that trace in the second array.

8. The interconnect structure of claim 7 wherein the continuous, substantially oxygen impermeable, anhygroscopic, inorganic dielectric matrix is formed from the insulating coating of the metal particles.

9. The interconnect structure of claim 7 wherein the continuous, substantially oxygen impermeable, anhygroscopic, inorganic dielectric matrix is a glass having a sintering temperature less than the melting point of the metal in the metal particles.

10. The interconnect structure of claim 9 wherein each of the metal particles has a generally smooth, rounded exterior configuration.

11. The interconnect structure of claim 8 wherein each of the metal particles has a generally smooth, rounded exterior configuration.

12. The interconnect structure of claim 7 further comprising:

a covering of insulating material disposed on the first and the second surface of the layer.

13. An interconnect structure comprising:

a layer of an electrically insulating material, the insulating layer having a first and a second surface thereon, a first array of conductive traces disposed on the first surface of the insulating layer, a second array of conductive traces disposed on the second surface of the insulating layer, each trace having an axis therethrough, the axes of each trace in the first array defining an angle with respect to the axes of the traces in the second array, the insulating layer having an array of vias formed therein, the vias extending between the first and second surfaces of the insulating layer, each trace in the first array communicating with at least one trace in the second array through at least one via, each via being filled with a matrix formed of a continuous, substantially oxygen impermeable, anhygroscopic, inorganic dielectric material, the inorganic dielectric material having therein a dispersion of metal particles, at least substantially all of the metal particles being coated by an insulating coating, the dispersion containing a sufficient quantity of coated particles such that substantially all of the coated particles are in abutting contact with at least one other particle, the application of an electrical potential between a conductive trace in the first array and a conductive trace in the second array sufficient to cause electrical breakdown of the coatings on the particles in the via disposed between that trace in the first array and that trace in the second array irreversibly forming an electrical conduction path through the via between that trace in the first array and that trace in the second array.

14. The interconnect structure of claim 13 wherein the continuous, substantially oxygen impermeable, anhygroscopic, inorganic dielectric matrix is formed from the insulating coating of the metal particles.

15. The interconnect structure of claim 13 wherein the continuous, substantially oxygen impermeable, anhygroscopic, inorganic dielectric matrix is a glass having a sintering temperature less than the melting point of the metal in the metal particles.

16. The interconnect structure of claim 15 wherein each of the metal particles has a generally smooth, rounded exterior configuration.

17. The interconnect structure of claim 14 wherein each of the metal particles has a generally smooth, rounded exterior configuration.

18. The interconnect structure of claim 13 wherein each of the metal particles has a generally smooth, rounded exterior configuration.

19. The interconnect structure of claim 13 further comprising:

a covering of insulating material disposed on the first and the second surface of the layer.

* * * * *